United States Patent
Takasaki et al.

(10) Patent No.: US 6,495,260 B1
(45) Date of Patent: Dec. 17, 2002

(54) METHOD OF PRODUCING EPOXY FOR MOLDING SEMICONDUCTOR DEVICE, MOLDING MATERIAL, AND SEMICONDUCTOR DEVICE

(75) Inventors: Noriyuki Takasaki, Tochigi; Kenji Takayama, Musashimurayama; Yoshiyuki Anai, Utsunomiya, all of (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/762,147
(22) PCT Filed: Dec. 22, 1999
(86) PCT No.: PCT/JP99/07228
§ 371 (c)(1),
(2), (4) Date: Feb. 1, 2001
(87) PCT Pub. No.: WO00/77851
PCT Pub. Date: Dec. 21, 2000

(30) Foreign Application Priority Data

Jun. 15, 1999 (JP) .............................................. 11-168861

(51) Int. Cl.$^7$ ........................ B32B 27/38; B02C 17/00; B02C 19/06
(52) U.S. Cl. ........................ 428/413; 241/23; 241/24.1; 241/24.12; 241/25; 427/96
(58) Field of Search ............................. 428/413; 366/14, 366/69; 241/23, 24.1, 25, 24.12; 264/211.12, 211.24; 427/96

(56) References Cited

U.S. PATENT DOCUMENTS

| | | | | |
|---|---|---|---|---|
| 4,615,741 A | * | 10/1986 | Kobayashi et al. | 106/287.34 |
| 4,720,515 A | * | 1/1988 | Iji et al. | 523/400 |
| 5,919,843 A | | 7/1999 | von Gentzkow et al. | |
| 6,225,377 B1 | * | 5/2001 | Markert et al. | 523/427 |

FOREIGN PATENT DOCUMENTS

| | | |
|---|---|---|
| EP | 0 490 065 A2 | 10/1991 |
| JP | 64-73651 | 3/1989 |
| JP | 2001149 A | 1/1990 |
| JP | 4-59863 | 2/1992 |
| JP | 09-052228 | 2/1997 |
| JP | 09-286845 | 11/1997 |
| JP | 10-1547 | 1/1998 |
| JP | 10-114815 | 5/1998 |

OTHER PUBLICATIONS

Australian Patent Office Search Report dated Jul. 31, 2001 for counterpart appln. No. SG 0100415–9.
European Patent Office Search Report dated Aug. 17, 2001 for counterpart appln. No. EP 00 11 8672.

* cited by examiner

Primary Examiner—Robert Dawson
Assistant Examiner—Michael J Feely
(74) Attorney, Agent, or Firm—Smith, Gambrell & Russell, LLP

(57) ABSTRACT

The present invention provides a process for producing an epoxy resin molding material for semiconductor encapsulation, which is very low in voids generation; a molding material produced by the process; and a semiconductor device obtained by encapsulation with the molding material. That is, the present invention provides a process for producing an epoxy resin molding material for semiconductor encapsulation, which comprises premixing a composition containing at least an epoxy resin, a phenolic resin and an inorganic filler, then subjecting the resulting mixture to grinding by a grinder to obtain a powder having such a particle size distribution that the amount of particles having particle diameters of 250 μm or more is 10% by weight or less, the amount of particles having particle diameters of 150 μm to less than 250 μm is 15% by weight or less, and the amount of particles having particle diameters of less than 150 μm is 75% by weight or more, and thereafter subjecting the powder to melt kneading; a molding material produced by the process; and a semiconductor device obtained by encapsulation with the molding material.

8 Claims, No Drawings

METHOD OF PRODUCING EPOXY FOR MOLDING SEMICONDUCTOR DEVICE, MOLDING MATERIAL, AND SEMICONDUCTOR DEVICE

TECHNICAL FIELD

The present invention relates to a process for producing an epoxy resin molding material low in voids generation during semiconductor encapsulation; a molding material produced by the process; and a semiconductor device obtained by encapsulation with the molding material.

BACKGROUND ART

For encapsulation of semiconductor elements such as IC, LSI and the like, epoxy resin molding materials, which are transfer-moldable, are widely used in view of the reliability and productivity of the encapsulation with these materials.

Epoxy resin molding materials are constituted by an epoxy resin, a phenolic resin, a curing accelerator, an inorganic filler, a releasing agent, a flame-retardant, a coupling agent, etc., and are generally produced by weighing individual raw materials by given amounts, premixing the raw materials using a stirrer and mixer such as Henschel mixer or the like, and then subjecting the resulting mixture to melt kneading using a hot kneader such as single-screw kneader, double-screw kneader, hot rolls, continuous kneader or the like to mix and disperse the raw materials uniformly.

Meanwhile, electronic appliances are becoming increasingly small, light and functional and, accordingly, the semiconductor packages used therein are becoming increasingly small, thin and narrow in pitch. In such a movement, epoxy resin molding materials used for semiconductor encapsulation are strongly required to have improved resistance to soldering heat and improved humidity resistance, since these resistances are relevant to the reliability of the semiconductor package obtained by encapsulation.

Hence, the amount of inorganic filler in epoxy resin molding material is being increased in order to reduce the stress and hygroscopicity of semiconductor package inside. However, this increase in amount of inorganic filler in epoxy resin molding material reduces the flowability of epoxy resin molding material during encapsulation and makes more serious the problems in molding such as deformation of lead frame, deformation of gold wire, generation of voids and the like.

As a countermeasure for the above, there is being continued an attempt of optimizing the shape and particle size distribution of inorganic filler, or an attempt of making very small the viscosity of resin components (e.g. epoxy resin and phenolic resin) at an encapsulation temperature to allow the resulting molding material to maintain a required flowability and have an improved chargeability. Nevertheless, the task of reducing voids is difficult to achieve and is becoming more and more important.

The voids of epoxy resin molding material are thought to be reduceable by increasing the degree of kneading of molding material during the step of melt kneading to increase the wettability between resin components and inorganic filler in molding material or the dispersibility of inorganic filler. However, increase in the degree of kneading during melt kneading step alone accelerates the curing of molding material by the heat applied in the step and, as a result, impairs the flowability of molding material.

Hence, there were disclosed a method which comprises selecting raw materials causing no curing in the step of premixing, melt-mixing them at a temperature higher than their melting or softening point, and then subjecting the resulting mixture to melt-kneading (e.g. JP-A-56-149454, JP-A-4-59863 and JP-A-3-195764); a method which comprises selecting an optimum hot kneader or optimum kneading conditions to minimize the proceeding of curing in the hot kneader and increase the wettability between resin components and inorganic filler in molding material or the dispersibility of inorganic filler (e.g. JP-A-9-52228); and so forth.

However, melt-mixing in the premixing step at a high temperature has restricted the raw materials usable; and selection of an optimum kneader or optimum kneading conditions alone has made it difficult to reduce voids generation stably.

DISCLOSURE OF THE INVENTION

Objects of the present invention are to provide a process for producing an epoxy resin molding material for semiconductor encapsulation, which is very low in voids generation; a molding material produced by the process; and a semiconductor device obtained by encapsulation with the molding material.

The present inventors made a research in view of the above situation. As a result, the present inventors newly found out that voids generation can be reduced remarkably by making raw materials into a finer and more homogeneous dispersion after their premixing but before their melt kneading. The present invention has been completed based on the finding.

The first aspect of the present invention lies in a process for producing an epoxy resin molding material for semiconductor encapsulation, which comprises premixing a composition containing at least an epoxy resin, a phenolic resin and an inorganic filler, then subjecting the resulting mixture to grinding by a grinder to obtain a powder having such a particle size distribution that the amount of particles having particle diameters of 250 μm or more is 10% by weight or less, the amount of particles having particle diameters of 150 μm to less than 250 μm is 15% by weight or less, and the amount of particles having particle diameters of less than 150 μm is 75% by weight or more, and thereafter subjecting the powder to melt kneading.

The second aspect of the present invention lies in a process for producing an epoxy resin molding material for semiconductor encapsulation, which comprises adding, to the composition set forth in the first aspect, at least one kind selected from a coupling agent, a curing accelerator, a flame retardant, a releasing agent, an ion-capturing agent, a coloring agent and a stress-reducing agent, premixing the resulting composition, then subjecting the resulting mixture to grinding by a grinder to obtain a powder having such a particle size distribution that the amount of particles having particle diameters of 250 μm or more is 10% by weight or less, the amount of particles having particle diameters of 150 μm to less than 250 μm is 15% by weight or less, and the amount of particles having particle diameters of less than 150 μm is 75% by weight or more, and thereafter subjecting the powder to melt kneading. In the first and second aspects, preferably the acetone-insoluble portion of the powder comprises particles having particle diameters of 212 μm or more in an amount of 0.5% by weight or less.

The third aspect of the present invention lies in a process for producing an epoxy resin molding material for semiconductor encapsulation, which comprises adding, to the composition set forth in the first aspect, a coupling agent, a curing accelerator, a flame retardant, a releasing agent, an ion-capturing agent, a coloring agent and a stress-reducing agent, premixing the resulting composition, then subjecting the resulting mixture to grinding by a grinder to obtain a powder having such a particle size distribution that the amount of particles having particle diameters of 250 μm or more is 10% by weight or less, the amount of particles having particle diameters of 150 μm to less than 250 μm is 15% by weight or less, and the amount of particles having particle diameters of less than 150 μm is 75% by weight or more, and thereafter subjecting the powder to melt kneading.

The fourth aspect of the present invention lies in an epoxy resin molding material for semiconductor encapsulation, produced by a process according to any of the first to third aspects.

The fifth aspect of the present invention lies in a semiconductor device obtained by encapsulating semiconductor elements with an epoxy resin molding material set forth in the fourth aspect.

DETAILED DESCRIPTION OF THE INVENTION

The present invention is described in detail below.

The epoxy resin used in the present invention has no particular restriction as to the kind as long as it has two or more epoxy groups in the molecule and it is solid at ambient temperature. There can be mentioned, for example, bisphenol type epoxy resin, biphenyl type epoxy resin, phenolic novolac type epoxy resin, cresol novolac type epoxy resin and alkyl-modified triphenolmethane type epoxy resin. These resins may be used singly or in admixture.

When there is used a crystalline epoxy resin such as biphenyl type epoxy resin or the like, the epoxy resin preferably has a melting point of 50 to 150° C. When the melting point is less than 50° C., the temperature of resin increases in premixing, owing to the heat generated by friction and the melting of resin begins, which may deteriorate workability strikingly and reduce productivity.

Meanwhile, when the melting point is more than 150° C., melting of epoxy resin in melt-kneading step requires a very high temperature; consequently, it is difficult to suppress the proceeding of curing and it may be impossible to maintain the flowability of molding material at an appropriate level during encapsulation.

The melting point of a resin can be measured easily by an ordinary method of judging the melting point of the resin in glass capillary from its appearance, or by a method using a differential scanning calorimeter.

The phenolic resin used in the present invention has no restriction as to the kind as long as it is solid at ordinary temperature. There can be mentioned, for example, phenolic novolac resin, cresol novolac resin, dicyclopentadiene-modified phenolic resin, phenol aralkyl resin, naphthol aralkyl resin and terpene-modified phenolic resin. These resins can be used singly or in admixture.

The coupling agent used in the present invention has no particular restriction as to the kind, but is preferably a silane coupling agent such as γ-glycidoxypropyltrimethoxysilane, γ-aminopropyltrimethoxysilane, γ-mercaptopropyltrimethoxysilane, vinyltriethoxysilane or the like. The coupling agent used for surface treatment of inorganic filler is more preferably an amino-type silane coupling agent. These coupling agents may be used singly or in admixture. Even when there is used a surface-treated inorganic filler, a coupling agent may be added further in premixing.

The inorganic filler used in the present invention includes a fused silica powder, a crystalline silica powder, alumina, silicon nitride, etc. They may be used singly or in admixture.

An inorganic filler surface-treated with a coupling agent may be used. This surface-treated inorganic filler may be used singly or in admixture of two or more kinds. There may be used a mixture of a surface-treated inorganic filler and a surface-non-treated inorganic filler. The amount of inorganic filler used is preferably 60 to 92% by weight based on total resin composition in view of the balance of moldability and reliability.

The curing accelerator used in the present invention can be a substance capable of accelerating the curing between epoxy group and phenolic hydroxyl group and can be one ordinarily used in a resin for semiconductor encapsulation.

There can be mentioned, for example, 1,8-diazabicyclo(5,4,0)undecene-7, triphenylphosphine and 2-methylimidazole. These may be used singly or in admixture.

The flame retardant used in the present invention can be exemplified by antimony oxides such as antimony trioxide, antimony pentoxide and the like; bromine compounds such as brominated epoxy resin and the like; metal compounds such as aluminum hydroxide, magnesium hydroxide, zinc borate and the like; phosphorus compounds such as phosphoric acid ester, red phosphorus and the like; and nitrogen compounds such as melamine and the like. However, the flame retardant is not restricted thereto.

The releasing agent used in the present invention can be exemplified by higher fatty acid esters such as carnauba, montanic acid ester and the like; higher fatty acids such as stearic acid, montanic acid and the like; higher fatty acid metal salts such as zinc stearate, calcium montanate and the like; higher fatty acid amides such as N-stearylstearamide, ethylenebisstearamide, m-xylylenebisstearamide and the like; and polyolefin compounds such as polyethylene, oxidized polyethylene and the like. The releasing agent is not restricted thereto.

The ion-capturing agent used in the present invention is a compound which can capture a cation (e.g. sodium ion or potassium ion) or an anion (e.g. chlorine ion or bromine ion) and which is added for prevention of corrosion of a semiconductor element. It can be exemplified by hydrotalcites, bismuth oxides and antimony pentoxide, but is not restricted thereto.

The coloring agent used in the present invention can be exemplified by carbon black and organic dyes and pigments such as azo compound, phthalocyanine compound and the like.

The stress-reducing agent used in the present invention is a low-elastic substance used in an epoxy resin composition to reduce the stress generated during molding of the composition or the stress generated during heating and cooling of the cured material of the composition. It can be exemplified by organic rubber components such as polybutadiene, acrylonitrile and the like, and silicone rubber components such as polydimethylsiloxane and the like; however, is not restricted thereto.

The main components used in the epoxy resin molding material of the present invention, such as epoxy resin, phenolic resin, inorganic filler and the like are premixed and then ground by a grinder, whereby these components of different nature are dispersed homogeneously owing to the effects of fine grinding and homogenization. The components such as flame retardant, releasing agent, ion-capturing agent, coloring agent, stress-reducing agent and the like are ordinarily used in the epoxy resin molding material composition each in a small amount of 5% by weight or less; however, these small amount components are dispersed homogeneously as well in the epoxy resin molding material composition because they are premixed and then ground by a grinder and, thereby, finely ground and homogenized.

The raw materials of epoxy resin molding material composition for semiconductor encapsulation, i.e. an epoxy resin, a phenolic resin, an inorganic filler, a flame retardant, a releasing agent, an ion-capturing agent, a coloring agent and a stress-reducing agent are premixed and then ground, whereby the epoxy resin, the phenolic resin, the agglomerates of raw materials, and the agglomerates generated in premixing are finely ground. As a result, a ground material (a powder) can be obtained which has such a particle size distribution that the amount of particles having particle diameters of 250 $\mu$m or more is 10% by weight or less, the amount of particles having particle diameters of 150 $\mu$m to less than 250 $\mu$m is 15% by weight or less, and the amount of particles having particle diameters of less than 150 $\mu$m is 75% by weight or more, and the acetone-insoluble portion of which comprises particles having particle diameters of 212 $\mu$m or more in an amount of 0.5% by weight or less.

When in the particle size distribution, the amount of particles having particle diameters of 250 $\mu$m or more is more than 10% by weight, the amount of particles having particle diameters of 150 $\mu$m to less than 250 $\mu$m is more than 15% by weight, and the amount of particles having particle diameters of less than 150 $\mu$m is less than 75% by weight and when the acetone-insoluble portion of the powder comprises particles having particle diameters of 212 $\mu$m or more in an amount of more than 0.5% by weight, no uniform dispersion is attained in melt kneading and, when the resulting molding material is used for encapsulation of semiconductor elements, the semiconductor device obtained has defects owing to the voids present in the molding material.

The particle size distribution of ground material was determined by using two kinds of sieves having a 250-$\mu$m mesh and a 150-$\mu$m mesh, a sample amount of 6 g/each time, and a powder tester produced by Hosokawa Micron K. K. (amplitude=1 mm, frequency=3,000 VPM, time=60 seconds).

The acetone insoluble portion of ground material was determined by placing 200 cc of acetone of purity of 99.5% or higher and 100 g of a ground material in a vessel, dissolving the ground material in the acetone at ordinary temperature using a vibrator (a shaker produced by Yamato K. K., frequency=3 Hz, vibration time=20 minutes), then passing the vessel content through a sieve having a mesh of 212 $\mu$m, drying the insoluble portion remaining on the sieve and measuring its weight, and calculating the weight ratio of the insoluble portion.

In the premixing of the present invention, a composition consisting of given amounts of raw materials is uniformly mixed in a Henschel mixer or the like. Then, the premix is finely ground and homogenized by a grinder.

The grinder has no particular restriction as to the kind as long as it can produce a desired particle size distribution.

There are preferably used a vibration ball mill, a closed multi-stage shear extruder, a continuous rotary ball mill, a batchwise rotary ball mill, a corundum mill, a jet mill, a roller mill, etc. A combination thereof may be used. A grinder with a cooling mechanism is preferred to prevent the resin from being melted or softened in the grinding.

The hot kneader used in the melt kneading of the present invention has no particular restriction as to the kind. There can be used a single-screw kneader including a co-kneader, a twin-screw kneader, a hot roll, a continuous kneader, a Banbury mixer, etc.

In encapsulating semiconductor elements with the epoxy resin molding material of the present invention to produce a semiconductor device, molding such as transfer molding, compression molding, injection molding or the like can be used for curing and molding.

BEST MODE FOR CARRYING OUT THE INVENTION

The present invention is described specifically below by showing Examples and Comparative Examples. However, the present invention is in no way restricted to the following Examples. The following two kinds of basic compounding recipes were used.

| [Basic compounding recipe A] | |
|---|---|
| Biphenyl type epoxy resin (YX4000H produced by Yuka Shell Epoxy K. K.; melting point = 105° C.; epoxy equivalent = 195) | 7.6 parts by weight |
| Phenol aralkyl resin (XL225-LL produced by Mitsui Chemicals, Inc.; softening point = 75° C.; hydroxyl equivalent = 175) | 7.4 parts by weight |
| Brominated phenolic novolac type epoxy resin (Softening point = 85° C.; epoxy equivalent = 280) | 1.0 part by weight |
| 1,8-Diazabicyclo(5,4,0)undecene-7 | 0.2 part by weight |
| Fused silica | 80.0 parts by weight |
| γ-Glycidoxypropyltrimethoxysilane | 0.5 part by weight |
| Antimony trioxide | 1.0 part by weight |
| Bismuth oxide type ion-capturing agent (IXE-500 produced by Toagosei Co., Ltd.) | 1.0 part by weight |
| Carnauba wax | 0.5 part by weight |
| Carbon black | 0.3 part by weight |
| Organopolysiloxane (Represented by the following formula (1)) | 0.5 part by weight |

(1)

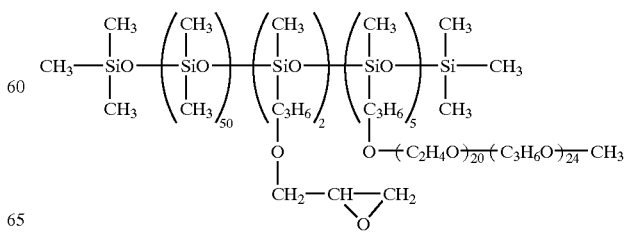

| [Basic compounding recipe B] | |
|---|---|
| Dicyclopentadiene type epoxy resin (Represented by the following formula (2); softening point = 60° C.; epoxy equivalent = 265) | 10.5 parts by weight |

(2)

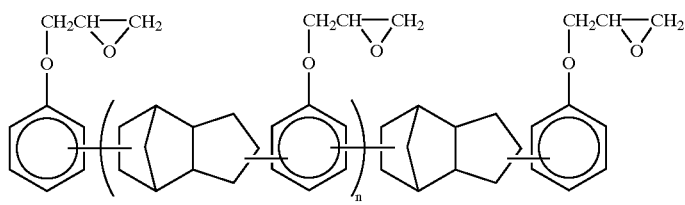

| | |
|---|---|
| Phenolic novolac resin (Softening point = 85° C.; hydroxyl equivalent = 104) | 4.5 parts by weight |
| Brominated phenolic novolac type epoxy resin (Softening point = 85° C.; epoxy equivalent = 280) | 1.0 part by weight |
| 1,8-Diazabicyclo(5,4,0)undecene-7 | 0.2 part by weight |
| Fused silica | 80.0 parts by weight |
| γ-Glycidoxypropyltrimethoxysilane | 0.5 part by weight |
| Antimony trioxide | 1.0 part by weight |
| Bismuth oxide type ion-capturing agent (IXE-500 produced by Toagosei Co., Ltd.) | 1.0 part by weight |
| Carnauba wax | 0.5 part by weight |
| Carbon black | 0.3 part by weight |
| Organopolysiloxane (Represented by the formula (1)) | 0.5 part by weight |

Evaluation Methods

1. Evaluation Methods of Ground Material

Acetone Insoluble Portion

In a vessel were placed 200 cc of acetone having a purity of 99.5% or more and 100 g of a ground material, and dissolution was allowed to take place at ordinary temperature using a vibrator (a shaker produced by Yamato K. K., frequency=3 Hz, vibration time=20 minutes). Then, the mixture in the vessel was passed through a sieve having a mesh of 212 μm; the insoluble portion remaining on the sieve was dried and then weighed; then, the weight ratio of the insoluble portion in acetone was determined.

Particle Size Distribution

Particle size distribution was determined using a tester (a powder tester produced by Hosokawa Micron K. K., amplitude=1 mm, frequency=3,000 VPM, time=60 seconds, mesh of sieve=two kinds of 250 μm and 150 μm, sample quantity=6 g/each time).

Degree of Dispersion of Composition Components

A sample (produced by subjecting the ground material to compression molding at room temperature at 100 kg/hr for 60 seconds, curing the molded material at 100° C. for 48 hours, encapsulating the cured material with an epoxy resin, polishing the resulting material, and vapor-depositing carbon on the polished material) was determined for the standard deviation of the distribution of silica strength by use an analyzer (an electronic probe microanalyzer made by Nihon Denshi K. K.), and the standard deviation was taken as a yardstick of the degree of dispersion of compounded components. Therefore, a larger value indicates that the dispersion of components is less uniform.

2. Evaluation Methods of Epoxy Resin Molding Material

Number of Voids

A semiconductor package 160 p QFP (body size=28 mm×28 mm, package thickness=3.6 mm, IC chip size=15 mm×15 mm) was produced by encapsulation. The number of voids having major axis lengths of 0.1 mm or more, remaining in the semiconductor package was observed using an ultrasonic flaw detector, and the number of voids per package was counted. The conditions of transfer molding (encapsulation), used for production of the semiconductor package were as follows: die temperature=175° C., injection pressure=100 kg/cm , injection time=15 seconds, holding time=120 seconds, and material-preheating temperature= 80° C.

Flowability

The epoxy resin molding material for semiconductor encapsulation was measured for spiral flow, using a transfer molding machine provided with a die for spiral flow measurement, based on EMMI-I-66. The conditions of transfer molding were as follows: die temperature=175° C., injection pressure=70 kg/cm$^2$, and holding time for curing= 120 seconds.

Degree of Dispersion of Composition Components

A sample (produced by subjecting the epoxy resin molding material for semiconductor encapsulation after melt kneading, to compression molding at 170° C. at 30 kg/hr for 120 seconds, encapsulating the molded material with an epoxy resin, polishing the resulting material, and vapor-depositing carbon on the polished material) was determined for the standard deviation of the distribution of silica strength by use of an analyzer (an electronic probe microanalyzer made by Nihon Denshi K. K.), and the standard deviation was taken as a yardstick of the degree of dispersion of compounded components.

EXAMPLE 1

The basic compounding recipe A was premixed for 20 minutes using a Henschel mixer (capacity=200 liters, number of rotations=900 rpm) set at room temperature; the premix was finely ground using a vibration ball mill (frequency=16 Hz, number of rotations=100 rpm, treatment amount=200 kg/hr) with the material temperature being kept at 30° C. or below; the ground material was melt-kneaded using an intermeshing co-rotating twin-screw extruder and kneader (screw diameter D=50 mm, extruder shaft length=600 mm, length of melt-kneading portion=6D, number of rotations of screw=100 rpm, discharge amount=30 kg/hr). The discharged material was wound round a hot roll and made into a sheet of 2 mm in thickness; then, the sheet was cooled and ground to obtain an epoxy resin molding material.

In Table 1 are shown the evaluation results of the ground material obtained by premixing and subsequent grinding and the epoxy resin molding material obtained by melt kneading.

EXAMPLE 2

In the same manner as in Example 1, the basic compounding recipe A was premixed for 20 minutes using a Henschel mixer (capacity=200 liters, number of rotations=900 rpm) set at room temperature; the premix was finely ground using a closed multi-stage shear extruder (a continuous kneader and extruder, KCK80X2V, produced by KCK K. K., rotational blade=Φ80, number of blades=4, number of rotations of blade=300 rpm, discharge amount=20 kg/hr) with the material temperature being kept at 30° C. or below; the ground material was melt-kneaded using a single-screw extruder and kneader (screw diameter D=46 mm, extruder shaft length=500 mm, length of melt-kneading portion=7D, number of rotations of screw=200 rpm, discharge amount=30 kg/hr). The discharged material was made into a sheet of 2 mm in thickness using a roll for thickness control (a sheeting roll); then, the sheet was cooled and ground to obtain an epoxy resin molding material.

In the same manner as in Example 1, the evaluation results are shown in Table 1.

EXAMPLE 3

In the same manner as in Example 1, the basic compounding recipe A was premixed for 20 minutes using a Henschel mixer (capacity=200 liters, number of rotations=900 rpm) set at room temperature; the premix was finely ground using a continuous rotary ball mill (Dynamic Mill MYD 25 produced by Mitsui Mining Co., Ltd., number of rotations of screw=500 rpm, ball diameter=10 mm, discharge amount=200 kg/hr) with the material temperature being kept at 30° C. or below; the ground material was melt-kneaded using a single-screw extruder and kneader (screw diameter D=46 mm, extruder length=500 mm, length of melt-kneading portion=7D, number of rotations of screw=200 rpm, discharge amount=30 kg/hr). The discharged material was wound round a hot roll and made into a sheet of 2 mm in thickness; then, the sheet was cooled and ground to obtain an epoxy resin molding material.

In the same manner as in Example 1, the evaluation results are shown in Table 1.

EXAMPLE 4

In the same manner as in Example 1, the basic compounding recipe A was premixed for 20 minutes using a Henschel mixer (capacity=200 liters, number of rotations=900 rpm) set at room temperature; the premix was finely ground using a batchwise rotary ball mill (number of rotations=30 rpm, ball diameter=25 mm, treatment amount=90 kg/hr) with the material temperature being kept at 30° C. or below; the ground material was melt-kneaded using an intermeshing co-rotating twin-screw extruder and kneader (screw diameter D=50 mm, extruder shaft length=600 mm, length of melt-kneading portion=6D, number of rotations of screw=100 rpm, discharge amount=30 kg/hr). The discharged material was made into a sheet of 2 mm in thickness using a roll for thickness control (a sheeting roll); then, the sheet was cooled and ground to obtain an epoxy resin molding material.

In the same manner as in Example 1, the evaluation results are shown in Table 1.

EXAMPLE 5

In the same manner as in Example 1, the basic compounding recipe A was premixed for 20 minutes using a Henschel mixer (capacity=200 liters, number of rotations=900 rpm) set at room temperature; the premix was finely ground using a corundum mill (number of rotations=100 rpm, discharge amount=30 kg/hr) with the material temperature being kept at 30° C. or below; the ground material was melt-kneaded using an intermeshing co-rotating twin-screw extruder and kneader (screw diameter D=50 mm, extruder shaft length=600 mm, length of melt-kneading portion=6D, number of rotations of screw=100 rpm, discharge amount=30 kg/hr). The discharged material was wound round a hot roll and made into a sheet of 2 mm in thickness; then, the sheet was cooled and ground to obtain an epoxy resin molding material.

In the same manner as in Example 1, the evaluation results are shown in Table 1.

EXAMPLE 6

In the same manner as in Example 1, the basic compounding recipe A was premixed for 20 minutes using a Henschel mixer (capacity=200 liters, number of rotations=900 rpm) set at room temperature; the premix was finely ground using a roller mill (number of rolls=3, discharge amount=300 kg/hr) with the material temperature being kept at 30° C. or below; the ground material was melt-kneaded using a single-screw extruder and kneader (screw diameter D=46 mm, extruder length=500 mm, length of melt-kneading portion=7D, number of rotations of screw=200 rpm, discharge amount=30 kg/hr). The discharged material was made into a sheet of 2 mm in thickness using a roll for thickness control (a sheeting roll); then, the sheet was cooled and ground to obtain an epoxy resin molding material.

In the same manner as in Example 1, the evaluation results are shown in Table 1.

COMPARATIVE EXAMPLE 1

In the same manner as in Examples 1 to 6, the basic compounding recipe A was premixed for 20 minutes using a Henschel mixer (capacity=200 liters, number of rotations=900 rpm) set at room temperature; then, the premix was melt-kneaded using a single-screw extruder and kneader (screw diameter D=46 mm, extruder length=500 mm, length of melt-kneading portion=3D, number of rotations of screw=200 rpm, discharge amount=30 kg/hr). The discharged material was wound round a hot roll and made into a sheet of 2 mm in thickness; then, the sheet was cooled and ground to obtain an epoxy resin molding material.

In the same manner as in Examples, the evaluation results are shown in Table 1.

COMPARATIVE EXAMPLE 2

In the same manner as in Examples 1 to 6, the basic compounding recipe A was premixed for 20 minutes using a Henschel mixer (capacity=200 liters, number of rotations=

900 rpm) set at room temperature; then, the premix was melt-kneaded using a single-screw extruder and kneader (screw diameter D=46 mm, extruder length=500 mm, length of melt-kneading portion=7D, number of rotations of screw=200 rpm, discharge amount=30 kg/hr). The discharged material was made into a sheet of 2 mm in thickness using a roll for thickness control (a sheeting roll); then, the sheet was cooled and ground to obtain an epoxy resin molding material.

In the same manner as in Examples, the evaluation results are shown in Table 1.

extruder and kneader (screw diameter D=50 mm, extruder shaft length=600 mm, length of melt-kneading portion=6D, number of rotations of screw=100 rpm, discharge amount= 30 kg/hr). The discharged material was made into a sheet of 2 mm in thickness using a roll for thickness control (a sheeting roll); then, the sheet was cooled and ground to obtain an epoxy resin molding material.

In the same manner as in Examples, the evaluation results are shown in Table 1.

TABLE 1

| Example No./Comparative Example No. | | | Example | | | | | | Comparative Example | | | |
|---|---|---|---|---|---|---|---|---|---|---|---|---|
| | | 1 | 2 | 3 | 4 | 5 | 6 | 1 | 2 | 3 | 4 |
| Symbol of basic compounding recipe | | A | A | A | A | A | A | A | A | A | A |
| Fine grinder used after premixing (Note 1) | | (1) | (2) | (3) | (4) | (5) | (6) | Not used | Not used | Not used | Not used |
| Extruder and kneader | Kind | Twin screw | Single screw | Single screw | Twin screw | Twin screw | Single screw | Single screw | Single screw | Twin screw | Twin screw |
| | Length of kneading portion | 6D | 7D | 7D | 6D | 6D | 7D | 3D | 7D | 3D | 6D |
| Properties of material fed to kneader | Particle size distribution (%) | | | | | | | | | | |
| | 250 μm or more | 2 | 5 | 3 | 2 | 4 | 2 | 19 | 19 | 19 | 19 |
| | 150 to 250 μm | 10 | 15 | 9 | 9 | 10 | 10 | 18 | 18 | 18 | 18 |
| | Less than 150 μm | 88 | 80 | 88 | 89 | 86 | 88 | 63 | 63 | 63 | 63 |
| | Acetone insoluble (%) | 0.1 | 0.2 | 0.1 | 0.1 | 0.2 | 0.1 | 3.1 | 3.1 | 3.1 | 3.1 |
| | Degree of dispersion (Note 2) Standard deviation | 120 | 130 | 123 | 120 | 125 | 115 | 145 | 145 | 145 | 145 |
| Properties of epoxy resin molding material after melt kneading | Voids (Number/package) | 13 | 11 | 12 | 10 | 13 | 15 | 50 | 41 | 55 | 43 |
| | Degree of dispersion Standard deviation | 52 | 53 | 52 | 52 | 54 | 54 | 60 | 57 | 61 | 58 |
| | Spiral flow (CM) | 86 | 85 | 85 | 83 | 82 | 85 | 90 | 78 | 80 | 78 |

COMPARATIVE EXAMPLE 3

In the same manner as in Examples 1 to 6, the basic compounding recipe A was premixed for 20 minutes using a Henschel mixer (capacity=200 liters, number of rotations= 900 rpm) set at room temperature; then, the premix was melt-kneaded using an intermeshing co-rotating twin-screw extruder and kneader (screw diameter D=50 mm, extruder shaft length=600 mm, length of melt-kneading portion=3D, number of rotations of screw=100 rpm, discharge amount= 30 kg/hr). The discharged material was wound round a hot roll and made into a sheet of 2 mm in thickness; then, the sheet was cooled and ground to obtain an epoxy resin molding material.

In the same manner as in Examples, the evaluation results are shown in Table 1.

COMPARATIVE EXAMPLE 4

In the same manner as in Examples 1 to 6, the basic compounding recipe A was premixed for 20 minutes using a Henschel mixer (capacity=200 liters, number of rotations= 900 rpm) set at room temperature; then, the premix was melt-kneaded using an intermeshing co-rotating twin-screw (Note 1) Fine Grinder
  (1) Vibration ball mill
  (2) Closed multi-stage shear extruder
  (3) Continuous rotary ball mill
  (4) Batchwise rotary ball mill
  (5) Corundum mill
  (6) Roller mill
(Note 2) Degree of Dispersion
  As a yardstick of the degree of dispersion of components used, there was used the standard deviation of the distribution of silica strength.

EXAMPLES 7 to 12

The basic compounding recipe A used in Examples 1 to 6 was changed to the basic compounding recipe B; premixing and subsequently fine grinding were conducted in the same manner as in Examples 1 to 6; then, melt kneading was conducted in the same manner as in Examples 1 to 6; the discharged material was wound round a hot roll and made into a sheet of 2 mm in thickness; thereafter, the sheet was cooled and ground to obtain epoxy resin molding materials.

In Table 2 are shown the particle size distribution and acetone insoluble portion of each ground material obtained by premixing and subsequent grinding, and the evaluation results of each epoxy resin molding material obtained by melt kneading.

COMPARATIVE EXAMPLES 5 to 8

The basic compounding recipe A used in Comparative Examples 1 to 4 was changed to the basic compounding recipe B; melt kneading was conducted in the same manner as in Comparative Examples 1 to 4; the discharged material was wound round a hot roll and made into a sheet of 2 mm in thickness; thereafter, the sheet was cooled and ground to obtain epoxy resin molding materials.

In the same manner as in Examples, the evaluation results are shown in Table 2.

TABLE 2

| Example No./Comparative | | Example | | | | | | Comparative Example | | | |
|---|---|---|---|---|---|---|---|---|---|---|---|
| Example No. | | 7 | 8 | 9 | 10 | 11 | 12 | 5 | 6 | 7 | 8 |
| Symbol of basic compounding recipe | | B | B | B | B | B | B | B | B | B | B |
| Fine grinder used after premixing (Note 1) | | (1) | (2) | (3) | (4) | (5) | (6) | Not used | Not used | Not used | Not used |
| Extruder and kneader | Kind | Twin screw | Single screw | Single screw | Twin screw | Twin screw | Single screw | Single screw | Single screw | Twin screw | Twin screw |
| | Length of kneading | 6D | 7D | 7D | 6D | 6D | 7D | 3D | 7D | 3D | 6D |
| Properties of material fed to kneader | Particle size distribution (%) | | | | | | | | | | |
| | 250 μm or more | 2 | 5 | 4 | 2 | 4 | 2 | 17 | 17 | 17 | 17 |
| | 150 to 250 μm | 9 | 6 | 7 | 9 | 6 | 10 | 7 | 7 | 7 | 7 |
| | Less than 150 μm | 89 | 89 | 89 | 89 | 90 | 88 | 76 | 76 | 76 | 76 |
| | Acetone insoluble (%) | 0.1 | 0.2 | 0.2 | 0.1 | 0.2 | 0.1 | 1.0 | 1.0 | 1.0 | 1.0 |
| Properties of epoxy resin molding material after melt kneading | Voids (Number/package) | 7 | 7 | 5 | 6 | 4 | 5 | 40 | 30 | 35 | 30 |
| | Spiral flow (CM) | 95 | 93 | 95 | 94 | 92 | 95 | 100 | 95 | 98 | 93 |

(Note 1) Fine Grinder (1) Vibration ball mill (2) Closed multi-stage shear extruder (3) Continuous rotary ball mill (4) Batchwise rotary ball mill (5) Corundum mill (6) Roller mill As clear from Table 1 and Table 2, the present invention enables production of an epoxy resin molding material for semiconductor encapsulation in which individual components are dispersed uniformly without giving rise to curing, and stable production of an epoxy resin molding material for semiconductor encapsulation which, when used for obtaining a semiconductor package by encapsulation, has sufficient flowability, generates substantially no voids and has excellent moldability.

Industrial Applicability

The present invention relates to a process for producing an epoxy resin molding material low in voids generation during semiconductor encapsulation; a molding material produced by the process; and a semiconductor device obtained by encapsulation with the molding material. Therefore, the present invention is very useful in all industries using semiconductors.

What is claimed is:

1. A process for producing an epoxy resin molding material for semiconductor encapsulation, which comprises premixing a composition containing at least an epoxy resin solid at ambient temperature, a phenolic resin solid at ambient temperature and an inorganic filler, then subjecting the resulting mixture to grinding by a grinder to obtain a powder having such a particle size distribution that the amount of particles having particle diameters of 250 μm or more is 10% by weight or less, the amount of particles having particle diameters of 150 μm to less than 250 μm is 15% by weight or less, and the amount of particles having particle diameters of less than 150 μm is 75% by weight or more, and thereafter subjecting the powder to melt kneading.

2. A process for producing an epoxy resin molding material for semiconductor encapsulation, according to claim 1, wherein said composition further comprises at least one component selected from the group consisting of a coupling agent, a curing accelerator, a flame retardant, a releasing agent, an ion-capturing agent, a coloring agent and a stress-reducing agent.

3. A process for producing an epoxy resin molding material for semiconductor encapsulation, according to claim 1, wherein said composition further comprises a coupling agent, a curing accelerator, a flame retardant, a releasing agent, an ion-capturing agent, a coloring agent and a stress-reducing agent.

4. A process for producing an epoxy resin molding material for semiconductor encapsulation, according to claim 1, wherein the powder has an acetone-insoluble portion comprised of particles having diameters of 212 μm or more in an amount of 0.5% by weight or less.

5. A process for producing an epoxy resin molding material for semiconductor encapsulation, according to claim 1, wherein the inorganic filler is an inorganic filler surface-treated with a coupling agent.

6. A process for producing an epoxy resin molding material for semiconductor encapsulation, according to claim 1, wherein the grinder is selected from the group consisting of a vibration ball mill, a closed multi-stage shear extruder, a continuous rotary ball mill, a batchwise rotary ball mill, a corundum mill, a jet mill and a roller mill.

7. An epoxy resin molding material for semiconductor encapsulation, produced by a process according to claim 1.

8. A semiconductor device obtained by encapsulating semiconductor elements with an epoxy resin molding material set forth in claim 7.

* * * * *